United States Patent
Le et al.

(10) Patent No.: US 6,449,840 B1
(45) Date of Patent: *Sep. 17, 2002

(54) COLUMN GRID ARRAY FOR FLIP-CHIP DEVICES

(75) Inventors: Bao Le, Santa Ana; Chris M. Schreiber, Lake Elsinore, both of CA (US)

(73) Assignee: Delphi Technologies, Inc., Troy, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,137

(22) Filed: Sep. 29, 1998

(51) Int. Cl.7 ............................................ H01R 43/00
(52) U.S. Cl. ......................... 29/852; 29/825; 29/829; 29/830; 29/840; 29/846; 29/847; 228/165
(58) Field of Search ........................ 29/843, 825, 829, 29/830, 840, 841, 842, 846, 847, 852; 228/180.21, 180.22, 179, 165, 179.1, 180.1, 254, 105

(56) References Cited

U.S. PATENT DOCUMENTS

| 4,249,302 A | | 2/1981 | Crepeau |
| 4,412,642 A | * | 11/1983 | Fisher, Jr. ............ 228/173 R X |
| 4,590,411 A | * | 5/1986 | Reimann ................ 156/634 X |
| 4,663,479 A | * | 5/1987 | Reimann ................ 174/68.5 X |
| 4,780,177 A | | 10/1988 | Wojnarowski et al. |
| 4,862,588 A | | 9/1989 | MacKay |

(List continued on next page.)

OTHER PUBLICATIONS

Photofabrication Methods with Kodak Photoresists, Pub. No. G–184, Eastman Kodak Co., 1979 pp. 1–32.

C4 Product Design Manual—Chapters 1 and 2—(Dates unknown).

Stanley Hirsch, "Tin–Lead, Lead and Tin Plating", Harstan Chemical Div., Chemtech Indus., Inc., Brooklyn, NY (Dates unknown), pp. 280–284.

Brzozowski et al, "Printed–Wiring Boards", Chapter 2, pp. 2.1–2.8, (Dates unknown).

Lithography and Photofabrication, pp. 10.19–10.30, (Dates unknown) Chapter Ten.

*Primary Examiner*—Joe H. Cheng
*Assistant Examiner*—Binh-An D. Nguyen
(74) *Attorney, Agent, or Firm*—Thomas N. Twomey

(57) ABSTRACT

A method for providing C4-type bumps which are higher than conventional C4 bumps. A dielectric substrate is copper cladded on both sides. At each prospective bump location, a via is laser ablated through the cladded substrate. A copper core is deposited within the vias to thereby connect the two claddings. A photoresist is applied to both claddings, a photomask having a predetermined exposure pattern is placed over the claddings, the photoresist is exposed to ultraviolet (UV) light to thereby polymerize in the exposed areas thereof, and the resulting photoresist image is developed by use of a developer solution to wash away of the unpolymerized areas of the photoresist. Now, the photoresist image provides a retainer wall spaced from, and circumferentially around, the vias. Next, a lead-tin solder alloy is electroplated, such as by a lead-tin fluoroborate bath, at the vias into the volumes defined by the retainer wall at each end of the vias. Now, the photoresist is stripped, such as by an alkali stripper, from the cladding, leaving behind a pair of solder deposits at each via. Next, the copper cladding is etched away using an ammonia based etchant, wherein the solder deposits are left intact. Finally, the solder deposits are subjected to reflow, whereupon the solder deposits form a pair of generally convexly shaped bumps connected to the copper core. In the preferred environment of practice, the bumps form a column grid array pattern arranged on an electronic device.

8 Claims, 3 Drawing Sheets

U.S. PATENT DOCUMENTS

| | | | | |
|---|---|---|---|---|
| 4,991,290 A | | 2/1991 | MacKay | |
| 5,046,238 A | * | 9/1991 | Daigle et al. | 29/830 X |
| 5,129,142 A | * | 7/1992 | Bindra et al. | 29/852 S |
| 5,136,359 A | | 8/1992 | Takayama et al. | |
| 5,233,157 A | | 8/1993 | Schreiber et al. | |
| 5,374,469 A | * | 12/1994 | Hino et al. | 428/209 X |
| 5,432,677 A | * | 7/1995 | Mowatt et al. | 361/719 X |
| 5,497,545 A | * | 3/1996 | Watanabe et al. | 29/830 X |
| 5,497,546 A | * | 3/1996 | Kubo et al. | 29/843 X |
| 5,699,612 A | * | 12/1997 | Inoue et al. | 29/843 X |
| 5,800,723 A | * | 9/1998 | Juskey et al. | 216/16 X |
| 5,895,581 A | * | 4/1999 | Grunwald | 216/13 X |
| 5,983,492 A | * | 11/1999 | Fjelstad | 29/843 X |

* cited by examiner

COLUMN GRID ARRAY FOR FLIP-CHIP DEVICES

TECHNICAL FIELD

The present invention relates to integrated circuits, and more particularly to solder bumped integrated circuit devices. Still more particularly, the present invention relates to a method of providing enhanced height bumps for bumped integrated circuit devices.

BACKGROUND OF THE INVENTION

Printed circuit boards (also referred to as printed wiring boards), hereinafter simply referred to as a "PCB", have become ubiquitous. PCB's typically are in the form of a dielectric substrate (such as for example an organic resin reinforced by fibers) which is cladded on one or both sides with a conductor (such as for example copper). The dielectric substrate is provided with a predetermined pattern of perforations for making connections with wiring and electrical devices, wherein the conductor is patterned so as to provide a predetermined electrical routing between the perforations so that the wiring and electrical devices are functionally interconnected.

During the 1960's IBM Corporation developed an alternative technology to hardwiring all interfaces, referred to commonly as "controlled collapse chip connection" or simply "C4". According to this technology, a chip is attached to the electronics of a PCB by matched contact of bumps on the chip with interface pads on the PCB. A chip provided with a series of bumps for C4 is referred to as a "flip chip". The bumps are typically a solder alloy (for example lead 97%, tin 3%) deposited by a bump mask onto wettable bump pads, and the interface pads on the PCB are also wettable whereby electrical and mechanical interconnections are formed simultaneously by reflowing of the bumps. Advantages of this technology include the reflowing compensating for chip-to-substrate misalignment incurred during chip placement and for the bumps to absorb stress.

The bumps are deposited onto the bump pads using a bump mask which is then removed. At this stage, the bumps resemble a truncated cone, being widest at the bump pad. Thereafter, a non-oxidizing reflow process is applied to the bumps, whereafter the bumps are convexly shaped, resembling truncated egg-shapes.

While C4 technology may be used to provide bumps on the chip, as was detailed hereinabove, it is to be noted that C4 technology may be equally well practiced to provide bumps on the PCB, wherein the chip is provided with the interface pads.

Problematically, the conventional method for forming bumps is only suited to high volume manufacturing operations, and the height of the bumps is limited to 1.5 times the bump pad radius.

What remains needed in the art is a simple process which provides bump heights twice that available conventionally.

SUMMARY OF THE INVENTION

The present invention is a method for providing C4-type bumps which are higher than conventional C4 bumps.

The method according to the present invention proceeds, generally, as follows. A dielectric substrate, such as for example polyimide, is cladded on both sides with copper. At each prospective bump location, a via is provided through the cladded substrate, as for example by laser. Next, a copper core is deposited, preferably in the form of a solid copper core, at each via to thereby connect the two claddings, such as for example by electrolysis and electrolytic plating. Thereafter, a photoresist is applied to both claddings, a photomask having a predetermined exposure pattern is placed over the claddings, the photoresist is exposed to ultraviolet light to thereby polymerize in the exposed areas thereof, and the resulting photoresist image is developed by use of a developer solution to wash away of the unpolymerized areas of the photoresist. Now, the photoresist image provides a retainer wall spaced from, and circumferentially around, each via. Next, a solder alloy, such as lead-tin, is electroplated, such as by a lead-tin fluoroborate bath, into the volumes defined by the retainer wall at each end of the vias. Now, the photoresist is stripped, such as by an alkali stripper, from the cladding leaving behind a pair of protruding solder deposits at each via. Next, the copper cladding is etched away using an ammonia based etchant, wherein the solder deposits at each via are left intact. Finally, the solder deposits at each via are subjected to reflow, whereupon the solder deposits at each via form a pair of generally convexly shaped bumps interconnected through the copper core of the respective via.

Accordingly, it is an object of the present invention to provide C4-type bumps which have a height in excess of 1.5 times the bump pad radius.

It is an additional object of the present invention to provide a simple method for providing C4-type bumps without the use of a conventional bump mask.

These, and additional objects, advantages, features and benefits of the present invention will become apparent from the following specification.

DESCRIPTION OF THE PREFERRED EMBODIMENT

Figure 1:
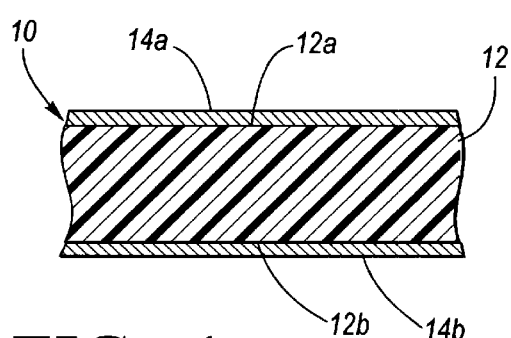
FIG. 1 is a sectional side view of a conductor cladded dielectric substrate.

Referring now to the Drawings, FIGS. 1 through 8 generally depict method steps to provide C4-type bumps according to the present invention which are higher than C4 bumps provided using conventional bump masks.

Referring firstly to FIG. 1, a cladded substrate 10 is provided. The substrate 12 is formed of a dielectric material, such as for example polyimide, KAPTON (a registered trademark of DuPont Corporation), acrylic, polyester or other dielectric materials well known in the electronics arts. Both sides 12a, 12b of the substrate 12 are cladded with conductor cladding 14a, 14b. The cladding 14a, 14b is preferably composed of copper. Cladding modalities are well known in the electronics arts. For example, copper foil rolled as a laminate onto the substrate, or micro clad sputtering a seed metal, such as monel, followed by sputtering of the copper cladding. The thickness of the cladding 14a, 14b is preferably on the order of about 0.0002 inch.

Figure 2:
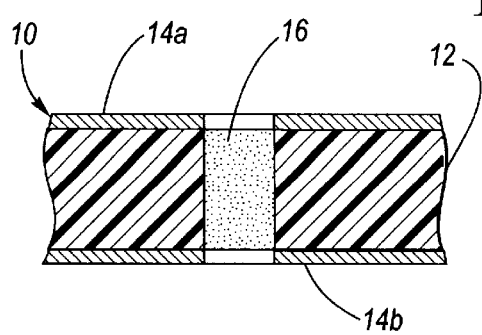
FIG. 2 is a partly sectional side view as in FIG. 1, where now a via has been formed therethrough.

Next, as shown at FIG. 2, a selected number of vias 16 are provided through the cladded substrate 10 for each prospective bump location. A preferred methodology to provide the vias 16 is a laser, most preferably an ultraviolet laser, as it does not fuse carbonaceous material, as a carbon dioxide laser could.

Figure 3:
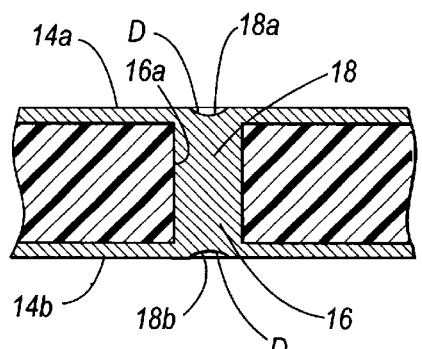
FIG. 3 is a partly sectional side view as in FIG. 2, where now a copper core is deposited in the via.

The next step, as shown at FIG. 3, is to deposit a copper core 18 at the barrel 16a of each of the vias 16, wherein the copper core conjoins with the claddings 14a, 14b at each end of the vias. In this regard, it is preferred to utilize an electrolysis step to seed copper at the barrel 16a, then to rapidly fully form the copper core 18 by an electrolytic plating step. Both electrolysis and electrolytic plating methodologies are well known in the plating arts. Preferably, the copper core 18 is solid with dimples D formed at each end 18a, 18b thereof, as shown in FIG. 3. While it is possible to provide a hollow copper core, this is not preferred because during a subsequent solder deposit step (described hereinbelow) an undesirable amount of hydraulicizing of the molten solder may occur.

Figure 4:
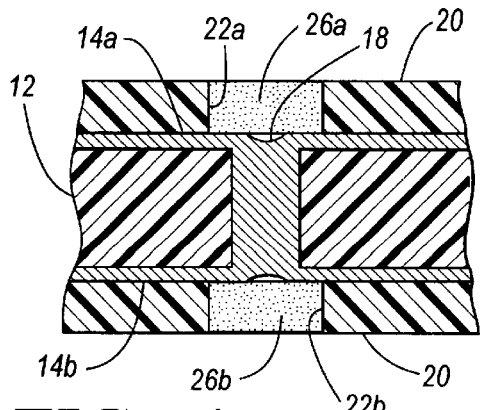
FIG. 4 is a partly sectional side view as in FIG. 3, where now a developed photoresist is present at each of the claddings, forming a retainer wall at each end of the via.
Figure 4A:
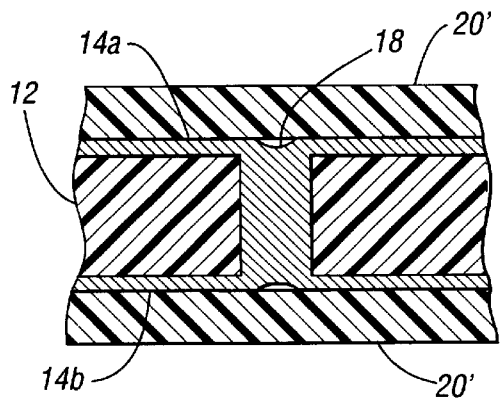
FIG. 4A is a partly sectional side view, showing a photoresist applied to the claddings of FIG. 3.
Figure 4B:
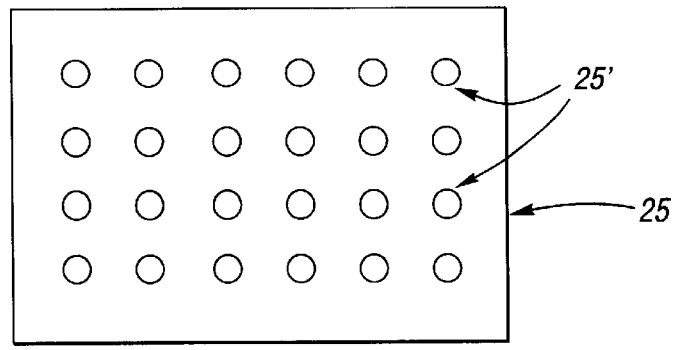
FIG. 4B is a plan view of a photomask with an ultra violet light exposure pattern.
Figure 4C:
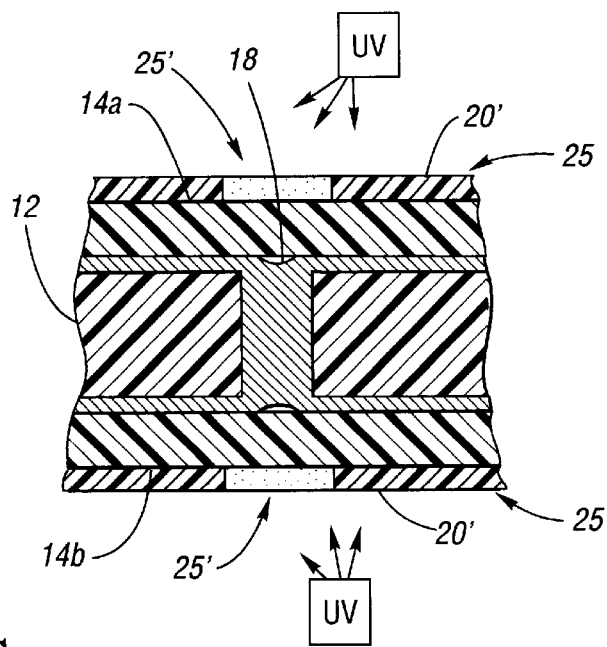
FIG. 4C is a partly sectional side view, showing the photomask placed aligningly over the photoresist of FIG. 4B.

As shown at FIG. 4, the next step provides a developed photoresist 20 on the claddings 14a, 14b. This step has several substeps depicted at FIGS. 4A through 4C. A photoresist chemical, such as liquid photoresists commercially available though Kodak Corporation and DuPont Corporation is coatingly applied to pre-cleaned surfaces of the claddings 14a, 14b. The coating photoresist 20' may be applied by spinning, spraying, rolling, electrophoretic dipping, screening or curtaining. Or, alternatively, a dry film photoresist commercially available through DuPont Corporation is applied to precleaned surfaces of the claddings. The dry film photoresist 20' is precoated on a polyolefin cover sheet, removed therefrom and then laminated onto the claddings by a laminator. Next, a pair of photomasks 25 is prepared having a predetermined ultraviolet light exposure pattern 25'. A photomask of the pair of photomasks is then placed, respectively, over each of the photoresist applied claddings. In so doing, the exposure pattern is aligned with respect to the pattern of the vias so that the area adjacent the vias will be masked from ultraviolet light. Then, with the photomask in place, the photoresist is exposed to ultraviolet light UV to thereby polymerize in the exposed areas thereof. Thereupon, the photomask is removed. Finally, the resulting photoresist image is developed by use of a developer solution to wash away the unpolymerized areas of the photoresist. These photoresist substeps are well known in the integrated circuit art and the photoresist techniques used therefor may be applicable to the present invention.

The remaining photoresist image provides an annular retainer wall 22a, 22b at, and circumferential to, each end of each via 16 (and each end 18a, 18b of the copper core 18). In this regard, the photomask provided an image for transmitting the ultraviolet light such that the retainer wall 22a, 22b is annular and spaced from each via as generally depicted at FIG. 4 to thereby form respective volumes 26a, 26b.

Figure 5:
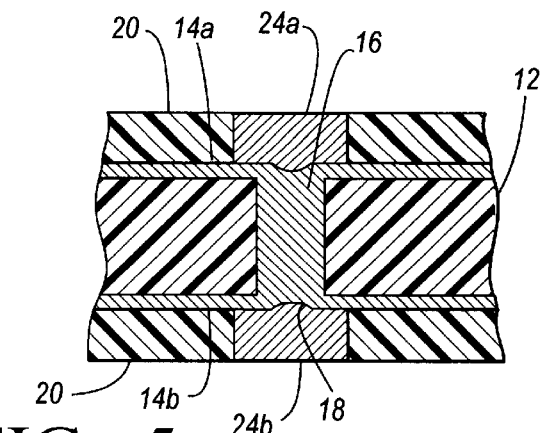
FIG. 5 is a sectional side view as in FIG. 4, where now solder is electroplated upon the ends of the via and into the volumes defined by the two retainer walls.

The next step, as shown at FIG. 5, provides solder deposits 24a, 24b at each via 16. In this regard, the solder deposits 24a, 24b respectively fill the volumes 26a, 26b defined, respectively, by the retainer walls 22a, 22b (identified in FIG. 4), and wettingly adjoin the ends 18a, 18b of the copper core 18. A preferred technique to provide the solder deposits 24a, 24b is to electroplate a lead-tin solder alloy by operation of a lead-tin fluoroborate bath (conventionally including boric acid and a peptone agent), which process is well known in the plating arts. The solder deposits 24a, 24b are each generally cylindrically shaped and protrude from the substrate 12.

Figure 6:
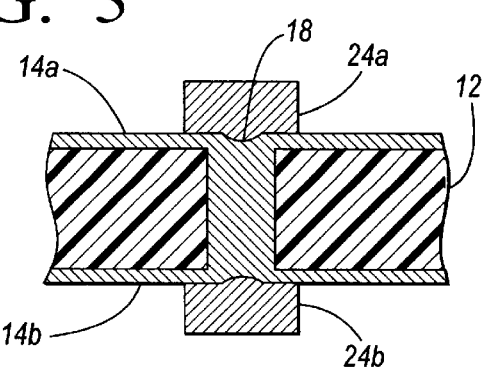
FIG. 6 is a sectional side view as in FIG. 5, where now the photoresist has been stripped away.

As shown at FIG. 6, the next step results in the photoresist being stripped away. Photoresist stripping is well known in the integrated circuit art, and photoresist strippers are commercially available, wherein most photoresists are alkali soluble.

Figure 7:
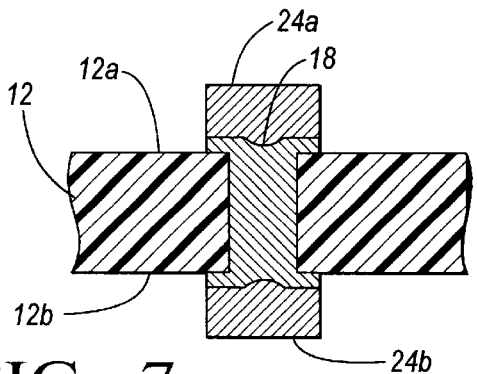
FIG. 7 is a sectional side view as in FIG. 6, where now the cladding has been etched away.

The next step, as shown at FIG. 7, results in the exposed areas of the claddings 14a, 14b being stripped away. This step is well known in the integrated circuit art, and a number of etchants are available, such as for example ammonium persulfate. In this step, only the exposed areas (that is, those areas external to the solder deposits 24a, 24b) of the claddings 14a, 14b is removed, while the solder deposits 24a, 24b (and areas of the claddings thereinside) are unaffected. An ammoniacal etchant is preferred as it etches copper but not tin-lead compositions.

Figure 8:
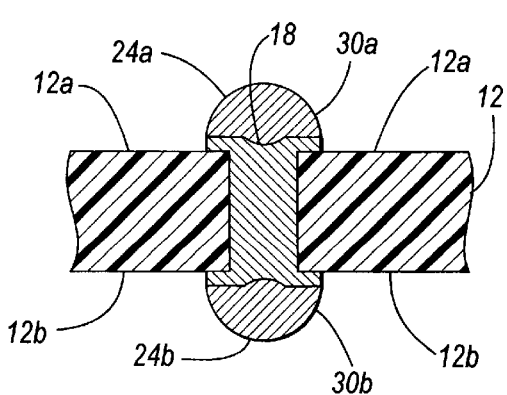
FIG. 8 is a sectional side view as in FIG. 7, where now the solder has been subjected to reflow.

Finally, as shown at FIG. 8, the solder deposits 24a, 24b are subjected to heating so as to reflow them into a pair of opposed bumps 30a, 30b, each having a generally convexly shaped configuration.

Figure 9:
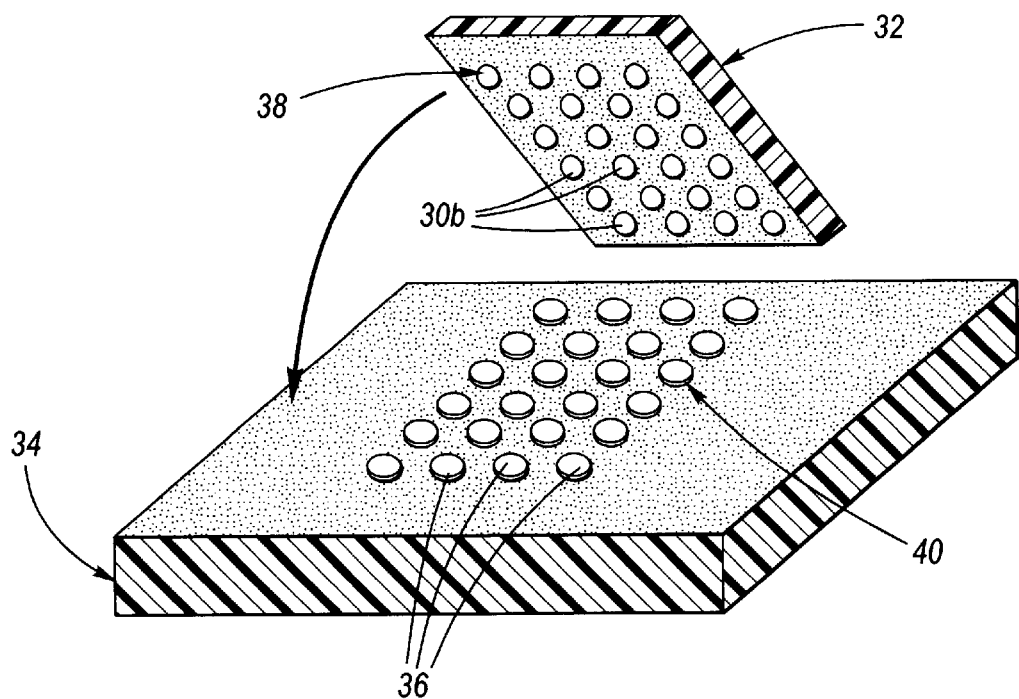
FIG. 9 is a perspective view, showing a grid column array of bumps on a first electronic device formed according to the process of FIGS. 1 through 8 about to be mated to an array of interface pads of a second electronic device.

FIG. 9 shows bumps 30b arranged in a column grid array pattern 38 on a first electronic device 32, wherein the bumps were fabricated according to the method of FIGS. 1 through 8. The first electronic device 32 is about to be interfaced in "flip chip" manner with a second electronic device 34. The interface pads 36 of the second electronic device 34 are arranged in a pattern 40 coinciding with the column grid array pattern 38 so that each bump 30b will contact a respective interface pad.

Figure 10:
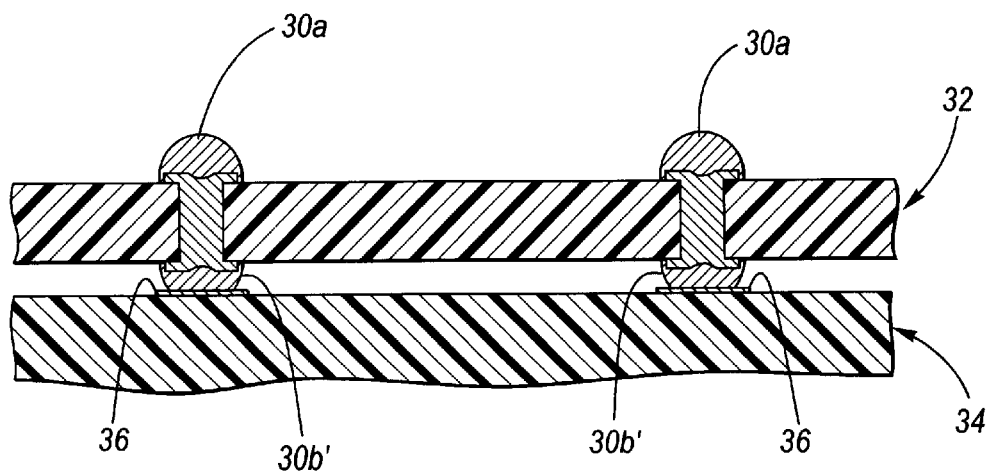
FIG. 10 is a sectional side view, showing bumps on the first electronic device formed according to the process of FIGS. 1 through 8 after reflow with interface pads of the second electronic device.

As shown at FIG. 10, after contact between the bumps 30b of FIG. 9 with the interface pads 36, heat is applied and wetted bumps 30b' flatly wet onto the interface pads, and upon solidification thereof the bump-to-pad interface serves to electrically and mechanically conjoin the first and second electronic devices 32, 34.

It will be understood that the method of the present invention provides C4-type bumps for "flip-chip" interfacing of electronic devices that are higher than 1.5 times the bump pad radius, even 2 times higher. This increased height serves to distribute strain inherent in C4 devices and thereby extends the device lifetime. Additionally, the present invention affords the ability to test electronic devices made according to the method of present invention prior to assembly, as well as I/O redistribution to grid arrays.

It is to be further understood, that bumps 30b may be provided on only one side of a cladded substrate, and that it is not essential that bumps 30a be provided simultaneously on the opposite side of the substrate. Further, the photoresist methodology described herein may be applied to a cladded substrate without vias, wherein the location of the solder deposits will be determined according to the photomask pattern utilized. Still further, the solder deposits may be of differing alloy compositions at each side of the substrate. Finally, it is possible to first provide the vias and then utilize a sputtering technique to simultaneously provide both the copper cladding and the copper cores. Any of the foregoing variations are to be considered within the metes and bounds of the invention, as the hereinabove recounted steps are merely to be understood as a preferred methodology for carrying out the invention.

To those skilled in the art to which this invention appertains, the above described preferred embodiments may be subject to change or modification. Such change or modification can be carried out without departing from the scope of the invention, which is intended to be limited only by the scope of the appended claims.

What is claimed is:

1. A method for providing a solder bumped electronic device comprising the steps of:

cladding at least one side of a substrate with a conductor to thereby provide a cladded substrate;

forming at least one via through the cladded substrate;

depositing copper into the at least one via to thereby form a copper core therein which is connected to the cladding;

forming a photoresist retainer wall adjacent the at least one via over the cladding, wherein the retainer wall defines at least one volume;

depositing solder having a fluid state in which the solder is freely conformable to the shape of any container into which it is deposited into the at least one volume, wherein the solder flowably conforms to the shape of the at least one volume, to thereby provide at least one solder deposit;

removing the photoresist from the cladding, wherein the at least one solder deposit remains and protrudes in relation to the substrate at the at least one via;

removing the cladding, wherein the at least one solder deposit remains; and reflowing the at least one solder deposit to thereby cause convex curving thereof.

2. The method of claim 1, wherein said step of forming at least one via provides a number of vias arranged in a column grid array pattern.

3. The method of claim 1, wherein said step of forming a photoresist retainer wall comprises:

applying a photoresist to the cladding;

making at least one photomask having a predetermined ultraviolet light transmission pattern;

placing the at least one photomask over the cladding, wherein the transmission pattern is aligned with the at least one via;

exposing the at least one photomask covered photoresist to ultraviolet light to thereby polymerize exposed areas of the photoresist; and developing a photoresist image, wherein unpolymerized areas of the photoresist are removed from the cladding to thereby form the retainer wall, wherein the retainer wall is spaced from, and circumferentially around, the at least one via, so as to thereby provide the at least one volume.

4. The method of claim 3, wherein said step of cladding provides cladding on opposing sides of the substrate; and wherein said step of forming provides a number of vias arranged in a column grid array pattern.

5. The method of claim 4, wherein said step of providing at least one solder deposit provides at least one first solder deposit at one side of the substrate, wherein the at least one first solder deposit has a first alloy composition, and at least one second solder deposit at the other side of the substrate, wherein the at least one second solder deposit has a second alloy composition.

6. A method for providing a solder bumped electronic device comprising the steps of:

cladding opposing sides of a dielectric substrate with a conductor to thereby provide a cladded substrate;

providing at least one via through the cladded substrate;

depositing copper at the at least one via to thereby form a copper core therein which is connected to the claddings;

applying a photoresist to the claddings;

making a pair of photomasks having a predetermined ultraviolet light transmission pattern;

placing a respective photomask of the pair of photomasks over each of the claddings, wherein the transmission pattern is aligned with the at least one via;

exposing the photomask covered photoresist to ultraviolet light to thereby polymerize exposed areas of the photoresist;

developing a photoresist image, wherein unpolymerized areas of the photoresist are removed from the claddings to thereby form a retainer wall spaced from, and circumferentially around, each end of the at least one via, wherein each retainer wall forms a volume circumferential to a respective end of the at least one via;

depositing solder having a fluid state in which the solder is freely conformable to the shape of any container into which it is deposited into the volumes at each end of said at least one via, wherein the solder flowably conforms to the shape of the volumes, to thereby provide at least one pair of solder deposits;

removing the photoresist from the claddings, wherein the at least one pair of solder deposits remains, and wherein each solder deposit thereof protrudes in relation to the substrate from each end, respectively, of the at least one via;

removing the claddings, wherein the at least one pair of solder deposits remain; and reflowing the at least one pair of solder deposits to thereby cause convex curving thereof.

7. The method of claim 6, wherein said step of forming at least one via provides a number of vias arranged in a column grid array pattern.

8. The method of claim 6, wherein said step of providing at least one solder deposit provides at least one first solder deposit at one side of the substrate, wherein the at least one first solder deposit has a first alloy composition, and at least one second solder deposit at the other side of the substrate, wherein the at least one second solder deposit has a second alloy composition.

* * * * *